United States Patent [19]
Leib

[11] Patent Number: 5,414,513
[45] Date of Patent: May 9, 1995

[54] PRINTED CIRCUIT INSPECTION SYSTEM UTILIZING INTERFERENCE FRINGES

[75] Inventor: Kenneth G. Leib, Wantagh, N.Y.

[73] Assignee: Northrop Grumman Corporation, Los Angeles, Calif.

[21] Appl. No.: 93,947

[22] Filed: Jul. 21, 1993

[51] Int. Cl.⁶ .............................................. G01B 9/02
[52] U.S. Cl. ................................ 356/359; 356/345; 356/392
[58] Field of Search ............... 356/359, 360, 357, 345, 356/392

[56] References Cited

U.S. PATENT DOCUMENTS

4,653,855  3/1987  Birnbach et al. .................. 356/345

Primary Examiner—Samuel A. Turner
Assistant Examiner—Russell C. Wolfe
Attorney, Agent, or Firm—Terry J. Anderson; Karl J. Hoch, Jr.

[57] ABSTRACT

Incorrectly assembled circuit boards become detected by directing interfering laser beams on the surface of a circuit board. Fringe patterns develop on the surfaces of electronic elements as well as the board proper. These fringe patterns are compared with those of a reference standard and anomalies become electronically detected.

9 Claims, 8 Drawing Sheets

PRINTED CIRCUIT INSPECTION SYSTEM UTILIZING INTERFERENCE FRINGES

FIELD OF THE INVENTION

The present invention relates to printed circuit inspection systems, and more particularly a laser system employing interference fringes.

BACKGROUND OF THE INVENTION

A constant need exists for improved means for inspecting printed circuit boards for missing components. The prior art includes a number of investigations directed to the use of a correlation process employing both digital, as well as optical, methods. However, these have met with limited success.

Straightforward digital techniques have also been examined. The main limitations have usually centered upon the degree of success in examining a circuit board in its entirety.

Two conventional techniques involving interferometry are known. The first has been used for many years to inspect such items as lenses. The technique utilizes a monochromatic beam (initially filtered light—later laser light) which is sent through the item to be inspected and combined with an uninterrupted beam. The path difference of the uninterrupted beam has phase changes in it so that, when combined, an anomaly becomes evident in a developed fringe pattern which is usually a set of parallel lines. A modification of this technique is to have one beam reflect from an opaque item (which could be a circuit board) and then combining the incident and reflected beams.

A second conventional technique projects a Moire pattern upon an item to be inspected and the reflected pattern is examined. The Moire effect is one in which two nearly identical sets of lines are perceived to interact causing deviations in an array of fringe lines for the field of lines where anomalies occur. This effect can be readily seen by viewing any TV picture through something like an ordinary screen, or looking at the screen when certain lined pictures are viewed. A modification of this approach could employ circular rings instead of parallel lines. Sets of sinusoidal waves, etc., could also be used.

BRIEF DESCRIPTION OF THE PRESENT INVENTION

The present invention utilizes fringe fields to develop an array of them for comparison with a standard. Voids and displacements of the arrays are monitored and detected as an anomaly. There is no light field measurement employed in the present invention.

Circuit boards or similar items to be inspected are positioned in a space where laser beams interfere. Interference lines project onto the components of the item being inspected and are imaged upon a detector. The fringe images are binarized and stored in memory. The fringe field is then compared with a previously stored reference interference pattern. Shifts and voids detected in the comparison are the basis for identifying and locating the missing component(s). More particularly, the fringes of an arbitrary board are imaged upon a detector and the fringes are compared in count and position with a standard reference board—the differences identifying the missing part(s) as well as its location. However, an incorrect part having the same dimensions as the correct part would not be detected.

Fringes and spacing are counted and noted much as the markings of UPC on consumer products are used to determine the type of product, size, description, current price, etc. In the latter case, the UPC codes are read at checkout by reading the reflection of a multi-angular input beam. In the present invention, the fringes are read electronically and compared to a stored array of fringes based upon those from a standard board.

The fringe array is generated during testing by the interference of two laser beams and the specific distribution of fringes is complex and arises because the size and shape of the components on a circuit board modify the apparent fringe pattern. Consequently, the absence of components or the placement of incorrect components will change the accepted fringe pattern and will be detected unless they are coincidentally the same size and shape as correct components. In the present invention, the fringe spacing, imaging angle, and other parameters can be optimized to enhance the detection process to meet a particular situation.

For example, on a board with large components, the number of fringe lines can be made less than a board with small components so that there is a constant number of fringes per standard size component. Also, the task may be made easier by arranging the location of the lasers generating the fringe pattern so that the fringes appear along the long dimension of the components. Different wavelength lasers could be combined and masked so that combinations of fringe patterns can be used on boards with a large difference in component sizes. In these cases it is obvious that an a priori judgment must be made at the inception of the inspection task regarding the prevailing orientation of the component layout, those to be inspected, those that are most important, or whatever the important guidelines are for the board. The combination of laser and imaging equipment can be a matter of logistical convenience.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1A:
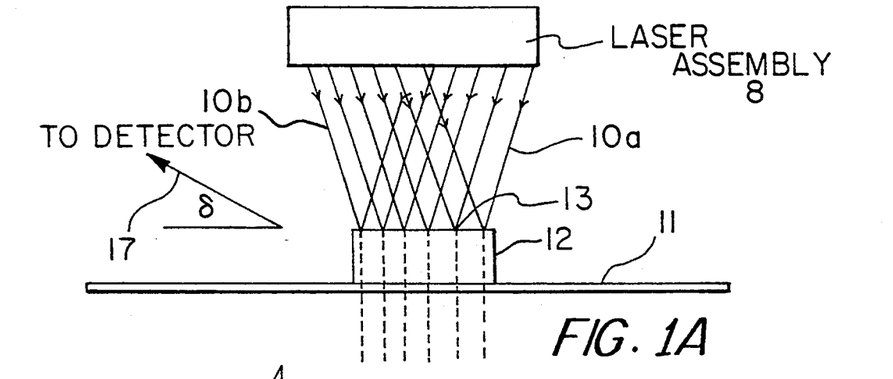
FIG. 1A is a diagrammatic illustration of laser beams impinging upon a circuit element.
Figure 1B:
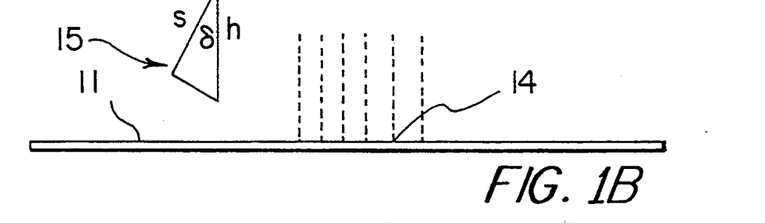
FIG. 1B is a diagrammatic illustration of laser beams impinging upon the surface of a circuit board, per se, with a circuit element missing.
Figure 1C:
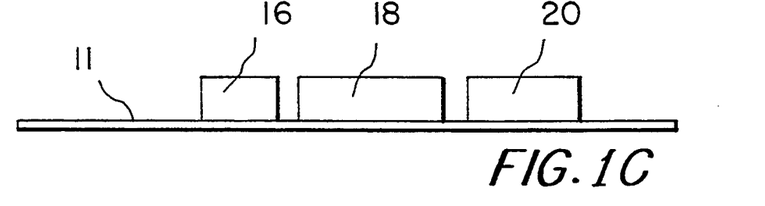
FIG. 1C is a diagrammatic illustration of three circuit elements connected to a printed circuit board.

The principal of the present invention is illustrated in FIGS. 1A–1C. As shown in FIG. 1A, the laser assembly 8 generates angularly converging beams 10a and 10b. These beams are caused to interfere on the upper surface 13 on a printed circuit element 12, which is mounted to a printed circuit board 11. The interfering laser beams cause an interference pattern formed on the upper surface 13. This interference pattern is imaged at a detector located along the optical axis 17 which is oriented at an angle $\delta$. Processing circuitry counts the interference pattern fringe lines and, with appropriate positioning information provided, a composite signature or element code for the printed circuit element may be generated.

Now considering FIG. 1B, the circuit element 12 is missing. The effect of the missing element is to displace the fringe pattern from the upper surface 13 of element 12 to area 14 on the upper surface of board 11. From the point of view of an imaging detection system, the fringe pattern remains the same but the position of the fringe count shifts in accordance with the following:

$$s = (\cos \delta) h \quad \text{Equation 1}$$

where h is the height of the circuit element; s is the shift; and $\delta$ is the angle between them.

Before proceeding further several basic ideas might be presented. First, the fringe lines are developed from two beams from the same laser. If these beams are plane waves (collimated beams), the interference lines are straight and have a separation determined by the formula:

$$\text{Separation} = L_o/(\sin \delta +/- \sin z) \quad \text{Equation 2}$$

where $L_o$ is the laser wavelength; and $\delta$, z are the angles of the two laser beams measured from the component board normal. When the beams are on opposite sides of the normal as shown in FIG. 1A, the (+) sign prevails; when they are on the same side, (−) prevails.

It should be clear that in Equation 2 a wide range of fringe spacings can be achieved with wavelength and beam angle settings. For example, at 632.8 nm and at 0.02°, a 19 mm long component would have the same number (10) of fringe lines that a 6 mm wide component will have at 0.06°.

Figure 2:
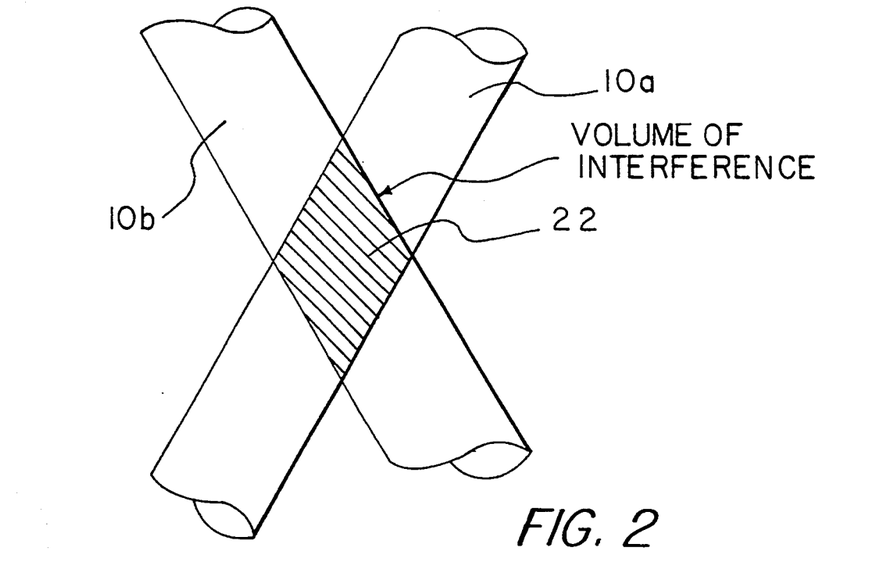
FIG. 2 is a diagrammatic illustration of intersecting laser beams which create a volume of interference.

Secondly, it should not be overlooked that the interference of the two laser beams is not a planar phenomena but occurs over a volume as shown in FIG. 2. The size of the volume of interference is determined by the size of the laser beams and the angle at which the interference occurs. Thus, the circuit board under inspection can be placed optimally in that volume but it is not critical. The observed and measured fringe pattern can be determined from Equation 2 when the board normal is known. If, for example, the board was tilted in the plane of the two laser beams, the frequency of the fringe pattern would be reduced. Thus, the angle between the circuit board to be inspected and the laser beam angle bisector is a third variable for adjusting the fringe pattern.

Refer now to FIG. 1C which illustrates the case in which three elements 16, 18, and 20 are assembled adjacent to one another on board 11. The two laser beams 10a and 10b will come from some angle at the right and the direction to a detector will be at an angle toward the left. If the center element were missing, the right component would mask the laser beams and the apparent fringe field would shift. The effect of this (which is the most prevalent situation) is to truncate the fringe pattern observed by a detector, i.e., fewer fringes are detected. Since each of the square-shaped circuit elements shown in FIG. 1C is of a different size, a different number of fringes will appear on each of their upper surfaces. The number of fringe lines is one of the element determinants, the second one being fringe location.

Figure 3A:
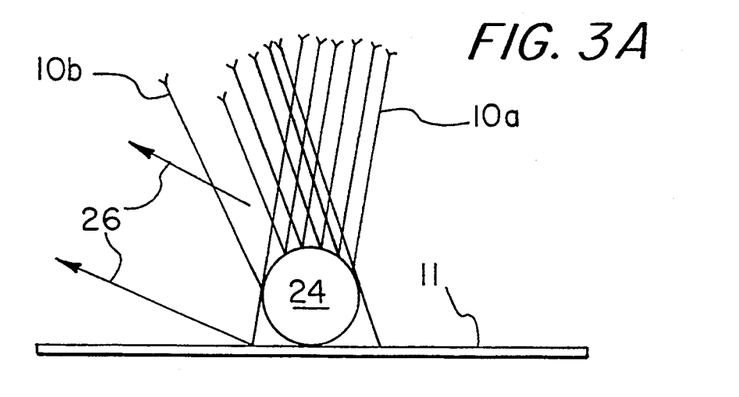
FIG. 3A illustrates the impingement of laser beams upon a cylindrical shaped electronic element.
Figure 3B:
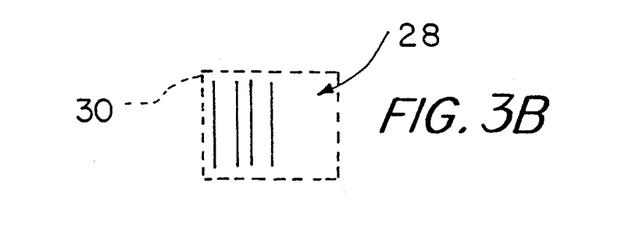
FIG. 3B is a diagrammatic illustration of a fringe pattern, in accordance with the present invention, which results from interfering beams, as shown in FIG. 3A.

The shape of a circuit element changes the fringe distribution symmetry. Consider FIG. 3A which shows a circuit board 11 in the volume of interference but with a circular circuit element 24 in place. The fringes are viewed from an angle along direction 26. Thus, if we consider the circular element 24, we can see that the fringe distribution 26 will be somewhat as that shown in FIG. 3B—it will be distributed unequally spaced with a blank portion, and within the element domain 30 (shown dotted). The term "element domain" refers to the area assigned to each circuit element. In a readout portion of the system to be discussed later, no other response for the fringe pattern is acceptable in the element domain except that due to the presence or absence of that particular circuit element. In this way any pattern other than the proper one would be rejected and indicate misalignment of the board, a wrong board, or a number of such erroneous situations.

Figure 4:
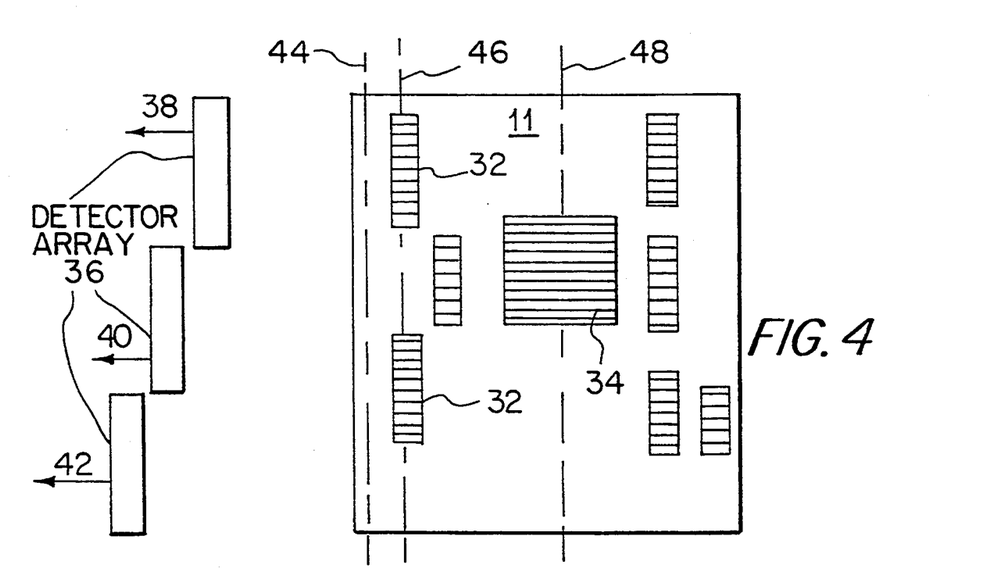
FIG. 4 is an illustration of fringe patterns present on the upper surfaces of several circuit elements on a printed circuit board.
Figures 6, 7, 8:
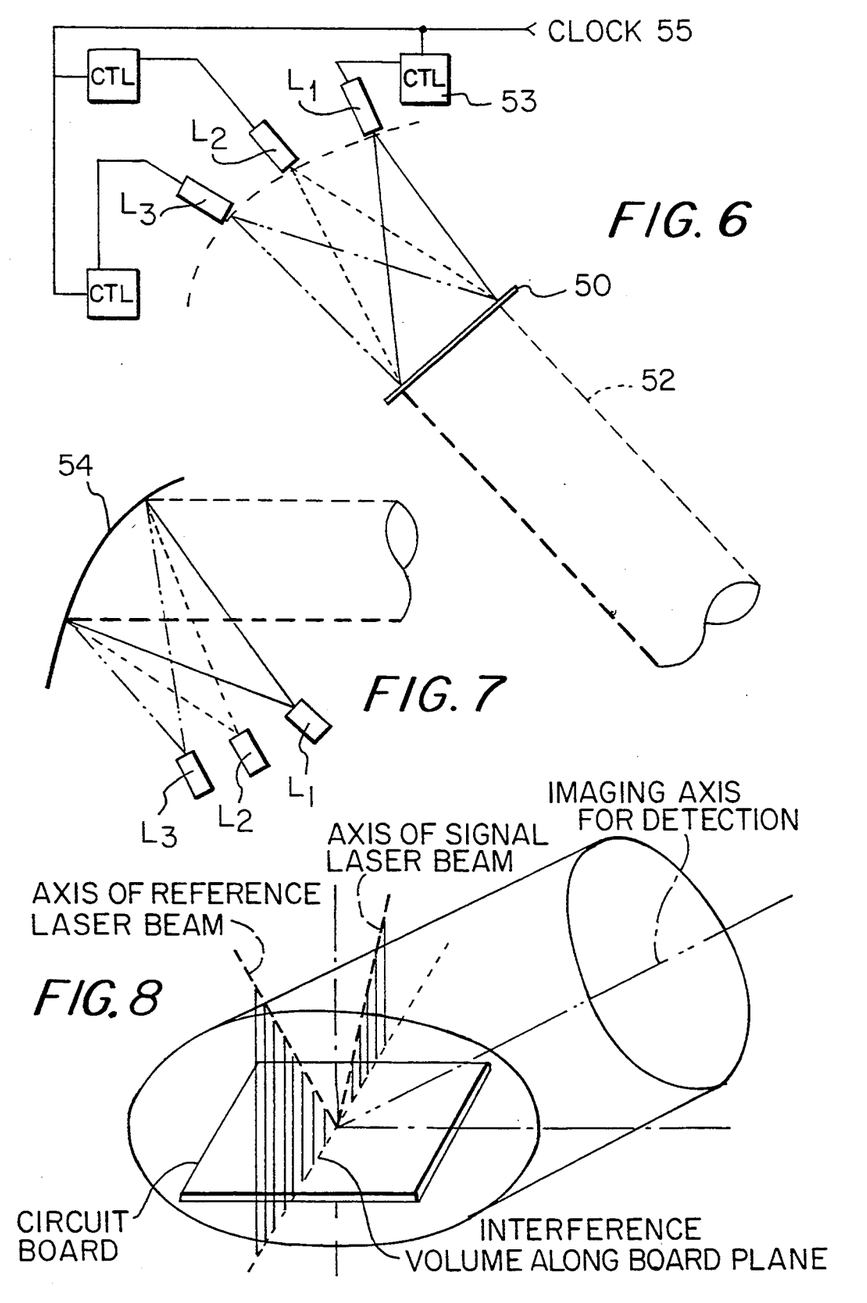
FIG. 6 is a diagrammatic illustration of three laser sources creating a single collimated beam after passing through a holographic lens.
FIG. 7 is a diagrammatic illustration of three laser sources creating a single collimated beam after reflection from a concave mirror.
FIG. 8 is a geometric view of impinging and reflected light axes, relative to a circuit board.

FIG. 4 indicates the fringe lines which become apparent on the circuit board 11, when a number of differently sized elements such as 32, 34 are subjected to interfering laser beams. The fringes are imaged upon a detector array 36, the individual detectors overlapping one another to cover the entire length of the board. The readout lines 38, 40, and 42 permit readout of electrical signals from the detectors, indicative of the fringe lines. The signals would then undergo A/D conversion, as will be discussed hereinafter. The geometric axis relationship for the laser beams and detection is indicated in FIG. 8.

There is a wide range of detectors available with a choice of 64, 128, 256, 512, 1024, or 2048 pixels. The choice is dictated by the specific design of board to be inspected. For example, a detector with 2048 pixels could be selected even though we might only be reading ten fringes from a component. Clearly, 204.8 = 204 pixels per fringe is a finer resolution than needed. Since the pixels can be paralleled, we can by hard wiring or through computer control ensure an appropriate paralleling. Thus, the three lines 38, 40, and 42 indicated in FIG. 4 might represent the output of 100 pixels.

Figure 5A:
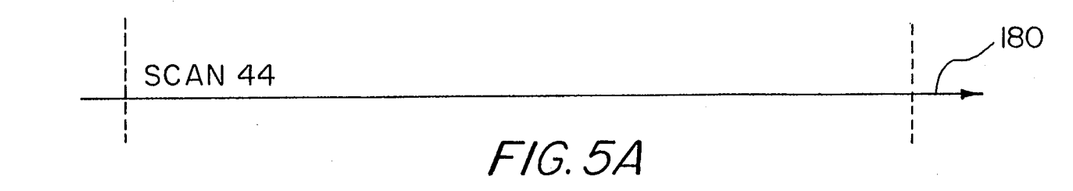
FIGS. 5A-5E are timing diagrams of circuit board scans.
Figure 5B:
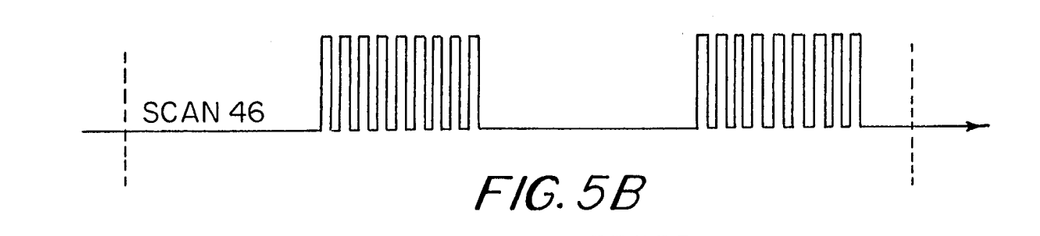
Figure 5C:
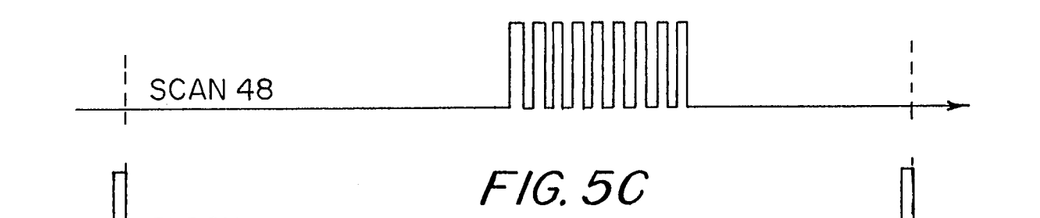
Figure 5D:
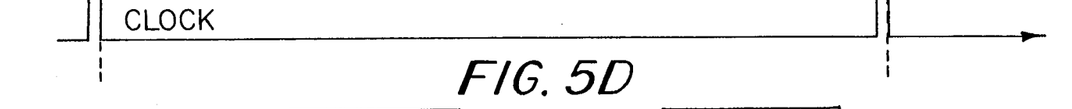
Figure 5E:
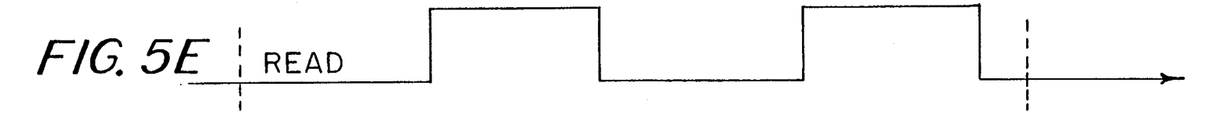

FIG. 4 illustrates three scan lines 44, 46, and 48 which occur at three corresponding periods of time. FIGS. 5A–5E represent a number of plots indicating electrical conditions during the scanning periods. The plot of FIG. 5D represents a clock pulse which initiates an appropriate pulse reading as well as establishing an interval during which reading of the pulses can take place through the action shown by the signal on FIG. 5E. Also, since an accurate map of components is available for a particular board design, one can establish the appropriate read interval for each line of interest as indicated above. This is indicated in FIG. 5B for the corresponding scan line 46. The electrical conditions during scans 44 and 48 are indicated in FIGS. 5A and 5C.

As an additional enhancement, a mask could be photographically produced so that, when placed in front of the detector array 36, fringes falling within a mask window will be capable of being read. The aperture so used must be configured to permit the entire fringe pattern to fall within the component present/not present area on a circuit board undergoing inspection. This is particularly important if a fringe detection area is modified by an angular viewing aspect, as for example with a cosine shift.

Up to this point we have been concerned with a single wavelength. As we saw from Equation 2, a given pattern would be developed with the wavelength specified. Consider that we change or have a different wavelength but the same angles of incidence as shown in FIG. 1A. A longer wavelength $L_o$ yields a larger separation and fewer lines on a fixed size circuit element. Conversely, shorter wavelengths lead to shorter separations and thus more lines on the element. This leads to two variations that can be incorporated. In the first we could change the wavelength according to the size of the elements to be inspected in order to ensure a minimum or fixed number of lines per circuit element, or in the second case, combine different wavelengths to accommodate various sizes of circuit elements. The combination can involve aperturing each appropriately and/or time sharing the different wavelengths in a rapid scan. This would involve two or more wavelengths to be combined in one beam 52 or time multiplexed, or the rapid switching of wavelengths in a multiwavelength laser source such as a dye laser.

FIG. 6 illustrates one method of combining several wavelengths simultaneously with a conventional holographic lens (HL) 50. In FIG. 6 the use of the HL is illustrated while the use of an accurate reflecting surface 54 is shown in FIG. 7. The accurate placement of the light sources $L_1$–$L_3$ and their angles is determined by the following:

$$F_1 = F_2 \times (L_2/L_1) \qquad \text{Equation 3}$$

and $$\text{Sin } 2 = (L_2/L_1) \times \text{Sin } 1 \qquad \text{Equation 4}$$

where the angular and focal position of sources $L_1$ and $L_2$ can be determined relative to each other. Having established one of them as the reference position, the position of the other, and any number of others, can be determined. The light sources are selectively energized by the indicated control circuits 53 connected to clock 55.

If the wavelength option is not of importance in establishing numbers of fringe lines (and probably most of the time it won't be) the wavelength option can also be used to improve the contrast of the imaged fringe pattern onto the detector since such parameters as wavelength, polarization state, and surface color and quality affect the contrast of the fringes on a particularly colored component as seen by the fringe image detector. For increased contrast of the fringe pattern, it would be desirable to set the detector imaging plane orthogonal to the plane determined by the two laser beams. The imaging plane is determined by the imaging component axis and the board normal. This orientation would eliminate the laser beam (other than the scattered fringe field) as background at the detector where the contrast ratio (CR) is:

$$CR = (Max\ I - Min\ I)/(Max\ I + Min\ I) \qquad \text{Equation 5}$$

where I is the interference volume as depicted in FIG. 8. The CR would decrease if Min I increases.

Figure 9A:
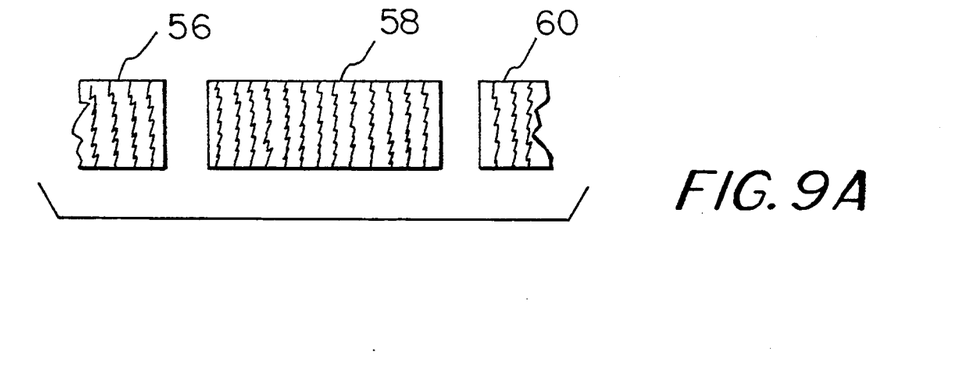
FIGS. 9A–9D illustrate fringe patterns and corresponding fringe distribution signals.
Figure 9B:
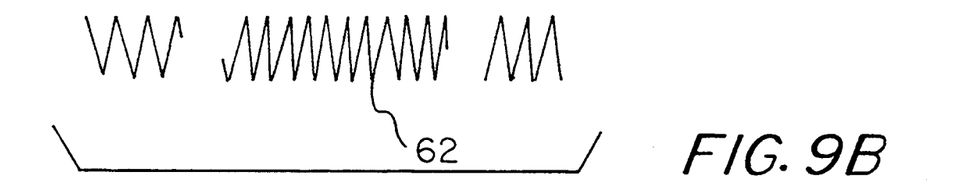
Figure 9C:
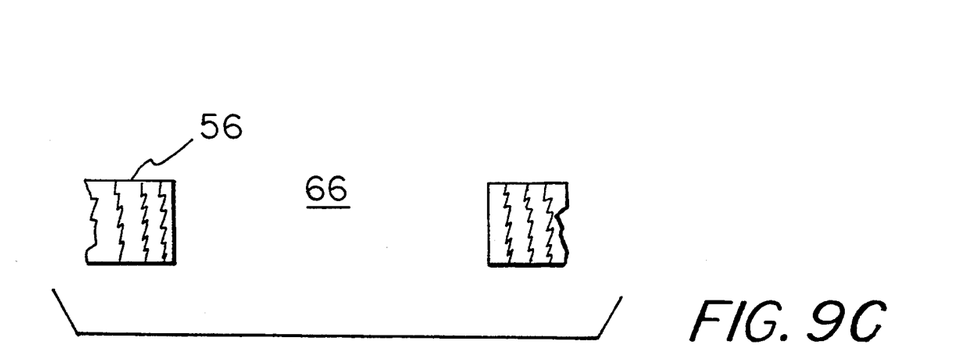
Figure 9D:
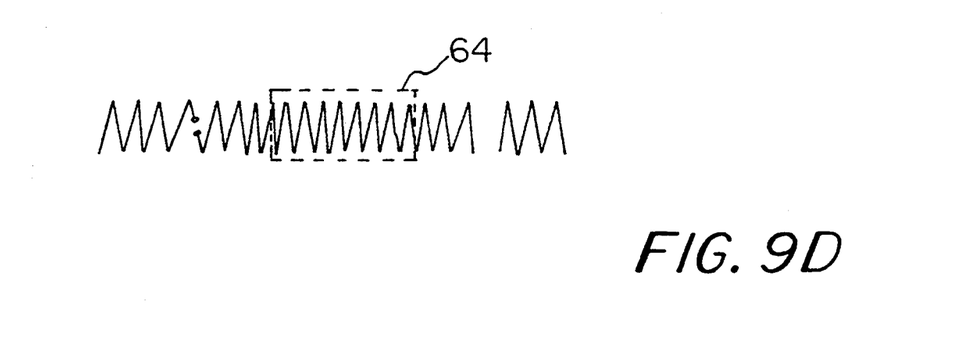

FIGS. 9A–9D and FIGS. 10A and 10B graphically illustrate the basis of pulse width/position generation. First, consider the schematic representation illustrated in FIG. 9A which shows the fringe pattern on the upper surface of several adjacent circuit elements. FIG. 9B indicates a corresponding plot of fringe pattern intensity distribution. FIG. 9C illustrates the fringe pattern which would occur in the event that the center indicated element of FIG. 9A were missing. FIG. 9D indicates a typical fringe pattern intensity distribution resulting from the missing component. Referring to FIG. 1, it will be remembered that the laser beams are angled toward the inspected circuit board so that the laser beams will be blocked or clipped as they pass at an angle along the transverse element surfaces toward the surface of the circuit board proper.

The fringe pattern intensity distribution within the dotted rectangle 64 (FIG. 9D) illustrates the resulting distribution when one considers the light blocking or shadow effect of the circuit elements 56 and 60 separated by a space 66 which would normally be occupied by a circuit element 58. Actually, the plot shown in FIG. 9D may also be slightly shifted to the left. This results from a shift in the fringe pattern which follows the angle bisector and the reference and signal beam angles used to form the fringe pattern. The angle of the laser beam from the right will also dictate the "shadowing" effect of the component on the right. This, too, will be specifically set by the beam angle and the circuit element height. It should also be realized that, even if only one of the fringe-forming beams is obscured by an element, no fringe pattern will be generated—it requires both beams.

Figure 10A:
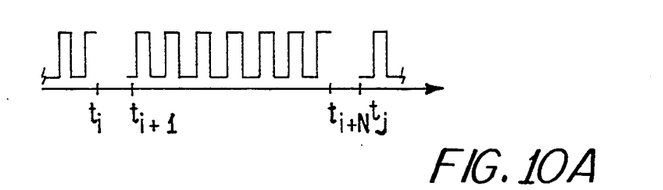
FIGS. 10A and 10B indicate normal and displaced timing diagrams indicating the shadow effect of circuit elements adjacent a circuit board void.
Figure 10B:
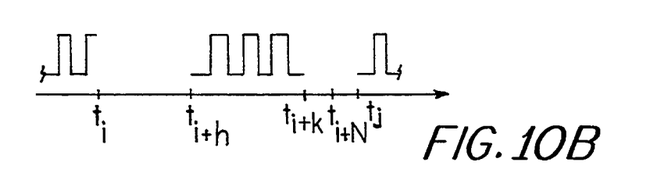

FIG. 10A indicates the electronic pulses which are developed when the scanned elements are present, as represented in FIG. 9A. In FIG. 10B, the electronic pulses have been developed where the center circuit element is missing, as indicated in FIG. 9C. In the plot of FIG. 10B, one sees the result of: (1) the missing element, therefore a phase shift compared with FIG. 10A; and (2) a truncation of the leading edge of the center pulse train due to the presence of the left circuit element 56 which blocks a portion of the fringe pattern as it impinges upon the circuit board spacer 66 indicated in FIG. 9C. A similar truncation occurs along the trailing edge of this central pulse train of FIG. 10B due to the presence of the right circuit element 60 (FIG. 9A). The starting time and ending time of the central pulse train in FIG. 10B are indicative of the missing central circuit element 58 of FIG. 9A.

The following discussion pertains to detector considerations. If we assume: (1) a CCD type of detector for the present system, typically having a modest assumption of 300×400 pixels active area; (2) a 4"×4" circuit board area imaged upon such a detector; and (3) finally ten components per four inches across the board using the narrow dimension of rectangular components, we obtain 30 pixels per component. Since we need two pixels per fringe (with spacing between fringes), 15 fringes across an average component is a viable attainment and it is more likely that ten or less would be needed for a component. With larger size pixel arrays, clearly the same requirement could be met; or one could image larger board areas upon such detectors. In practice, the compromises on inspection viewing area (and thus the imaging optics size), the size and shape of the components (and thus Equation 2 for the fringe separation to obtain a specified number of fringes per component), the component reflectivity (and thus choice of wavelengths), as well as other factors are needed in the final configuration of the system.

Figure 11:
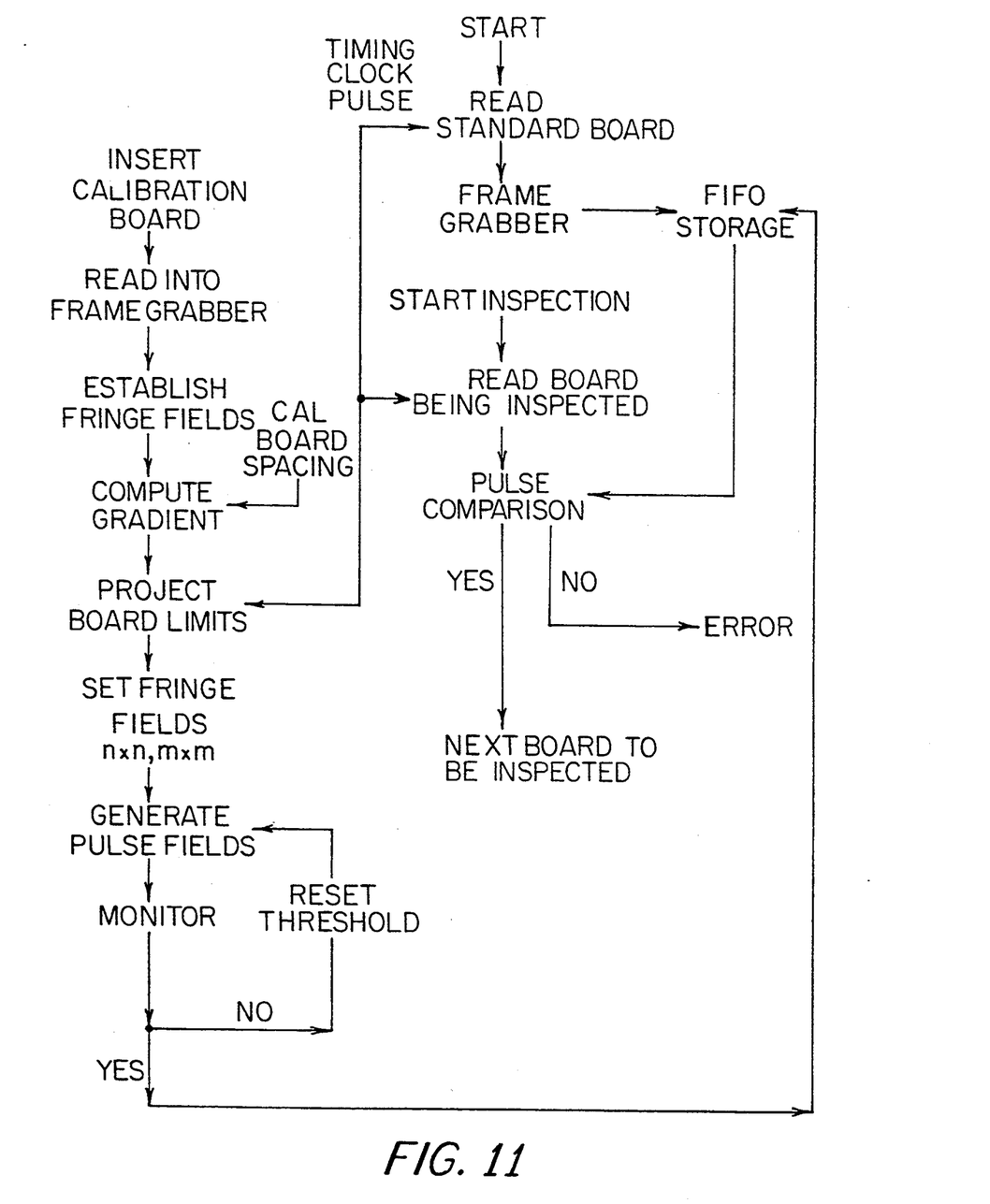
FIG. 11 is an operational flow chart in connection with the present invention.

FIG. 11 illustrates an operational flow chart of the invention. Overall, the idea is to set-up for reading a circuit board to be inspected by using a calibration board to establish the board limits, then a standard board which has been ascertained to be a generic one for which the inspections are intended to establish acceptable fringe regions, and finally, the boards to be inspected. In practice, the procedure is relatively easy once the basic equipment is at hand so that any other items needing inspection can be similarly processed. The indicated frame grabber is a commercially available circuit board with a special function processor. it will accept one or more frames for digital processing. It can be high resolution (e.g., 1024×1024), store one or more frames, and accept images from standard or non-standard line or frame scanners. In processing, it can with appropriate algorithms scan with selected pixel resolution elements, a process appropriate for isolating and examining fringe fields. They can be made to function with video contrast enhancement electronics enabling fringe fields to be thresholded, pulse trains to be read out, digitized and compared with stored pulse trains at the same coordinate locations. Thresholding is baseline subtraction which improves the contrast ratio. For example, if we subtract a baseline 4 units, a CR of $(10-5/10+5)=0.33$ becomes $(10-1/10+1)=0.82$, remembering we are using normalized ratios. This enables the pulse field (from the fringes) to be accurately formed.

Prior to establishing the fringe field and distribution for a "standard" circuit board, it may be necessary to perform a calibration on a board free of components to establish the limits on the board (i.e., the physical limits on the board as it is fed into inspection) as addressed to the circuit board inspection process. The reason for this is that, on the standard board, all components will be correctly included. We know, in fact, that at one extreme of PC boards are an array of conductors which usually get inserted into a linear receiving connector. Under some circumstances these conductors can be used to define board orientation. An array of components are established on a blank board. It is necessary for a board to be presented for calibration in the same manner as a completed board would be presented for inspection, i.e., with the same aspect and orientation. Moving board inspection is possible for this invention but requires additional aspects of calibration. The object is to recognize the fringe domains on the calibration board and then having foreknowledge of the positioning of the components (standard or reference board), project out to the boundaries of the board.

Figure 12:
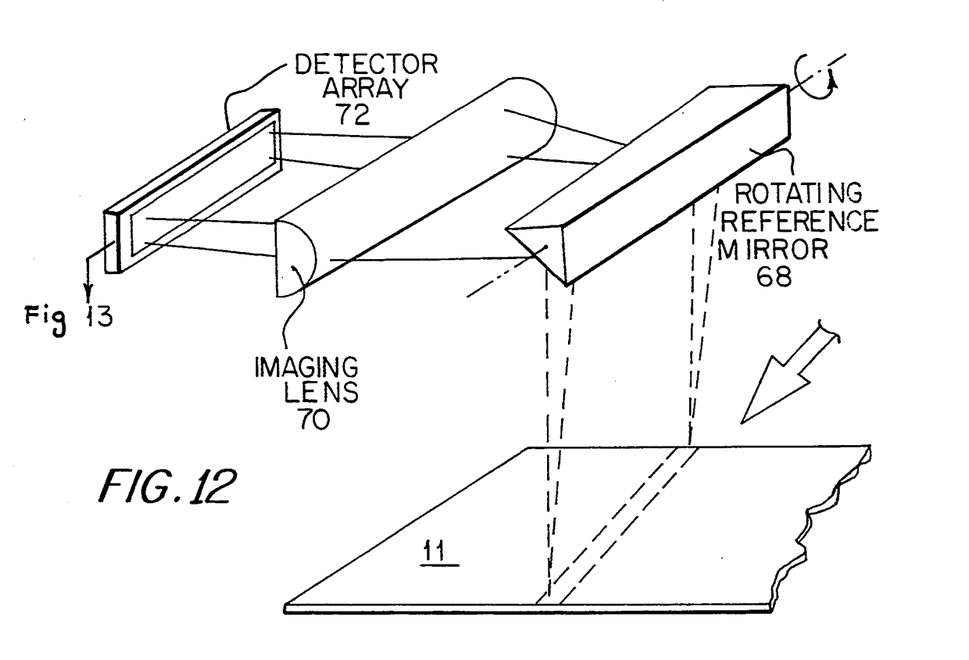
FIG. 12 is a perspective view of a preferred embodiment of the present invention wherein a circuit board is moved relative to fixed optics for scanning the surface of the board.

A second embodiment for reading the fringe fields on the components is illustrated in FIG. 12. In this system, a linear detector of high resolution (e.g., 2000 sensing elements or more along a line) receives the image by using a rotating mirror 68 to reflect the images of the fringes for the board 11 under inspection. The board is translated past the fixed optical system shown in the figure. It is believed that this method is superior to the previously described method in that it is more flexible in adapting to a wider variety of board sizes, and can provide inspection on a moving board basis. Timing is of the essence in this approach, one must time the passage of the board past the scanning area while the result is compared with a stored readout.

In FIG. 12, laser beams would impinge upon elements (not shown) as previously described. The fringe field distribution among the elements is ultimately imaged upon a linear detector array 72. Either the board 11 under inspection is moved along to the left while the optical system remains stationary, or the board is stationary and the mirror 68 makes periodic scans across the board. The mirror in conjunction with the imaging lens 70, direct fringe images onto the detector array 72. The output of the detector array 72 is directed to the electronics illustrated in FIG. 13.

Figure 13:
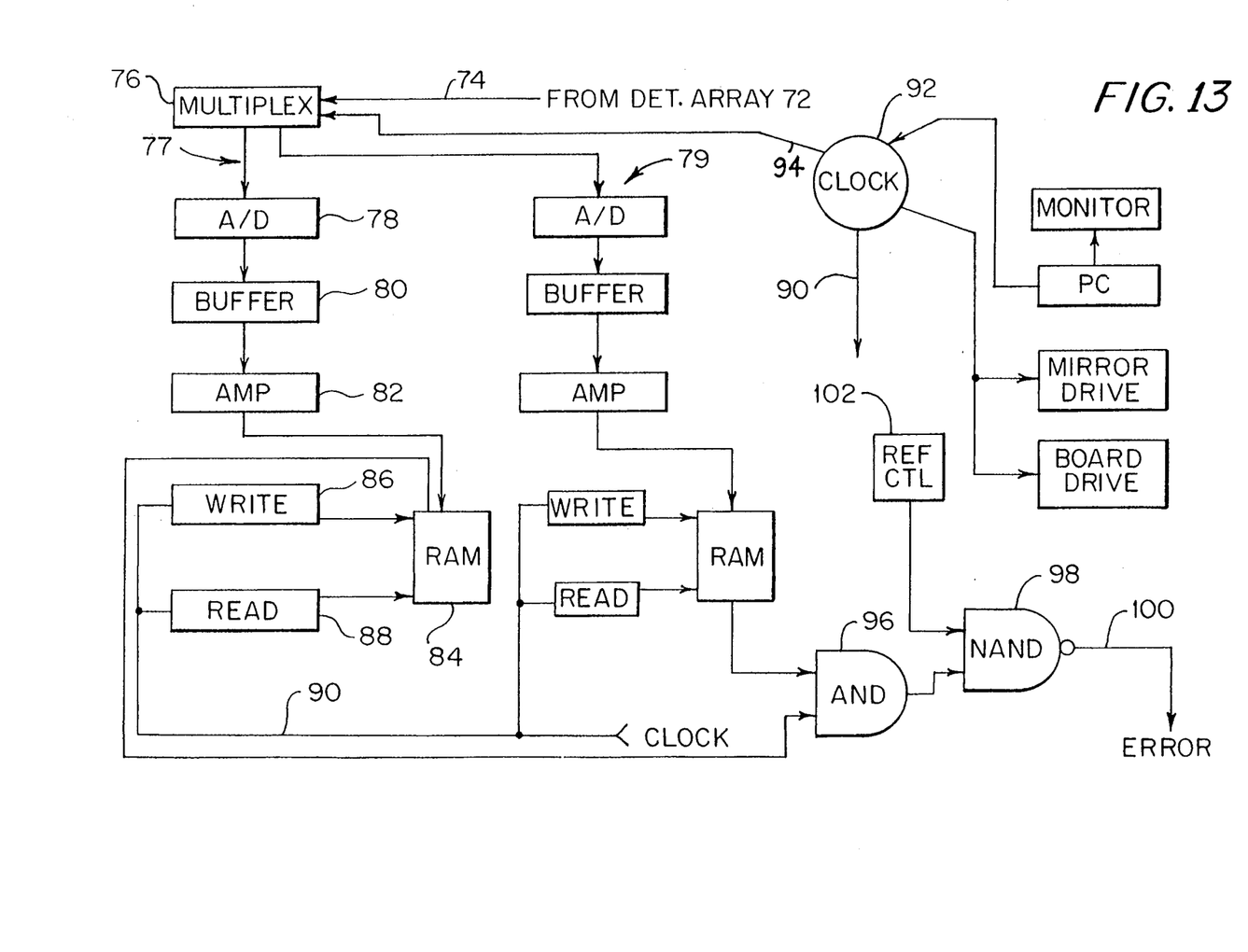
FIG. 13 is a block diagram of the circuit connected to the output of a detector array.

In FIG. 13 we note that the output 74 of the detector array 72 (FIG. 12) is fed to a multiplexer 76. This is a conventional circuit essentially including a series of gallium arsenide switches operating at high speed (approximately 10 nanosec.). The output of the multiplexer selectively switches to branch 77 or 79. The first mentioned branch 77 stores data relating to a standard or reference board that is known to include the correctly connected circuit elements. The branch 79 will cause the storing of fringe data of an actual board undergoing test. Each branch includes an A/D converter 78 which feeds digitized detector array data to a first in-first out (FIFO) buffer 80. After passing through amplifier 82, the digitized signal is loaded into RAM 84. WRITE and READ controls (86, 88) determine the direction of data flow relative to the RAM 84 and these circuits are connected to clock line 90. Clock 92 is also connected to the multiplexer 76 via line 94.

An AND gate 96 has its input connected to the output of both RAMs 84, the gate performing a comparison of reference and inspected board data to search for anomalies. A mismatch results in the unique output from gate 96. The output of the AND gate 96 is input to a NAND gate 98, along with the output from a reference control circuit 102. When a unique signal occurs at the output 100 of NAND gate 98, the occurrence of an error becomes detected. Thus, the system indicates, in real time, a problem with the circuit board undergoing inspection.

As will be noted, the clock 92 provides synchronization for a number of related system components. These include a board drive for powering a motor (not shown) which moves circuit board 11 while undergoing inspection. Further, the clock 92 provides signals to a mirror drive which would be a motor (not shown) for rotating mirror 68 (FIG. 12). The clock 92 is synchronized with a PC, as indicated in FIG. 13.

Thus, from the previous description of the figure, it will be appreciated that interference fringe optical technology may be employed to detect improperly manufactured circuit boards.

It should be understood that the invention is not limited to the exact details of construction shown and described herein for obvious modifications will occur to persons skilled in the art.

I claim:

1. A method for detecting anomalies on a fabricated printed circuit board, comprising the steps:

directing at least two intersecting beams of coherent light toward the surface of the board, creating a volume of optical interference at the intersection of the two beams;

positioning a printed circuit board to be inspected, with circuit elements thereon, in the volume of interference, detecting the interference fringe line patterns which develop on the elements;

comparing the fringe line patterns with reference patterns of a standard printed circuit board; and indicating any anomalies between the fringe line patterns and the reference patterns after comparison.

2. The method set forth in claim 1 wherein the coherent light beams exists at a single frequency.

3. The method set forth in claim 1 wherein the coherent light beams exists at multiple frequencies.

4. The method set forth in claim 1 together with the preliminary step of locating a calibration printed circuit board in the volume of interference for establishing a reference fringe line pattern.

5. A method for detecting incorrectly mounted elements of a printed circuit board comprising the steps:

directing at least two intersecting beams of coherent light toward an area, creating a volume of optical interference at the intersection of the two beams;

positioning a calibration board, free of circuit elements, in the volume of interference;

detecting the interference fringe line pattern which develop on the board;

reading the pattern into a frame grabber;

establishing fringe fields;

computing a gradient;

projecting physical board limits;

setting fringe fields;

converting the fringe fields to pulse train signals;

positioning a standard printed circuit board with circuit elements thereon, in the volume of interference;

detecting the interference fringe line pattern which develop on the elements of the standard board;

reading the pattern of the standard board into the frame grabber;

positioning a board undergoing inspection with circuit elements thereon, in the volume of interference for inspection;

detecting the interference fringe line pattern which develop on the elements of the board being inspected;

reading the pattern of the board being inspected into the frame grabber;

comparing pulse signals of the standard and inspected boards from the frame grabber; and indicating a difference between the pulse signals of the standard and the inspected boards, indicative of an anomaly if one exists.

6. A system for detecting anomalies on a fabricated printed circuit board having installed circuit elements, comprising:

means for directing at least two intersecting beams of coherent light toward the surface of the board, creating a volume of optical interference at the intersection of the two beams;

means for supporting the board in the volume of interference;

means for detecting interference fringe line patterns which develop on the elements;

means for comparing the fringe line patterns with standard patterns of a reference printed circuit board; and means for generating a signal indicating an anomaly between the fringe line and the standard patterns, after comparison.

7. The system set forth in claim 6 wherein the coherent light beams are generated from a single laser operating at a single frequency.

8. The system set forth in claim 6 wherein each coherent light beam is generated from a plurality of lasers, each operating at a different frequency; and a holographic lens is positioned in line, between the plurality of lasers and the fabricated circuit board, for collimating individual laser beams into a single beam.

9. The system set forth in claim 6 together with means for moving a circuit board relative to the means for detecting the fringe line patterns, the detecting means including:

a rotating mirror for scanning the surface of the fabricated board and the elements mounted thereto;

an imaging lens interposed along a reflection from the mirror, the reflection located along an optical path; and a detector located along the optical path—downstream of the lens.

* * * * *